United States Patent [19]

Nannini et al.

[11] Patent Number: 4,495,901
[45] Date of Patent: Jan. 29, 1985

[54] GENERATOR APPARATUS FOR THE COMBINED PRODUCTION OF ELECTRICAL ENERGY AND HEAT

[75] Inventors: Alessandro Nannini, Bruino; Roberto Pagano, Turin, both of Italy

[73] Assignee: Fiat Auto S.p.A., Turin, Italy

[21] Appl. No.: 479,546

[22] Filed: Mar. 28, 1983

[30] Foreign Application Priority Data

Mar. 31, 1982 [IT] Italy .............................. 53142/82[U]

[51] Int. Cl.³ ............................................ F02B 63/04
[52] U.S. Cl. ................................... 123/2; 123/195 C; 123/198 E; 290/1 A; 290/1 B
[58] Field of Search ................... 123/198 E, 195 C, 2; 290/1 R, 1 A, 1 B

[56] References Cited

U.S. PATENT DOCUMENTS 4,173,951 11/1979 Ishihara ........................... 123/198 E
4,226,214 10/1980 Palazzetti ......................... 123/198 E

FOREIGN PATENT DOCUMENTS 1249585 9/1967 Fed. Rep. of Germany ... 123/198 E
588405 1/1978 Japan ............................... 123/198 E
53-9902 1/1978 Japan ............................... 123/198 E
53-9942 1/1978 Japan ............................... 123/198 E
54-55207 5/1979 Japan ............................... 123/198 E Primary Examiner—Ira S. Lazarus
Attorney, Agent, or Firm—Sughrue, Mion, Zinn, Macpeak and Seas

[57] ABSTRACT

In generator apparatus for the combined production of electrical energy and heat, of the type comprising a support casing housing an internal combustion engine with an air filter the inlet of which communicates with an aperture in a side wall of the casing, an electrical machine coupled to the engine, and electronic circuits for controlling the operation of the engine and the electrical machine, a covering and protecting element is fixable sealingly and removably to the outer surface of the side wall of the casing to define a region between the element and the wall. The electronic circuits are supported by at least one plate fixed to the outer surface of the side wall in the region between the wall and the covering and protecting element, and the element has at least one aperture through which this region communicates with the exterior. In operation of the apparatus, the electronic circuits are ventilated by air which is drawn in by the engine and flows into the region through said at least one aperture.

1 Claim, 3 Drawing Figures

GENERATOR APPARATUS FOR THE COMBINED PRODUCTION OF ELECTRICAL ENERGY AND HEAT

The subject of the present invention is generator apparatus for the combined production of electrical energy and heat, of the type comprising a support casing which houses an internal combustion engine having an air filter the inlet of which communicates with an aperture formed in a side wall of the casing, and an electrical machine coupled to the engine and usable both for starting the engine and producing electrical energy.

Such generator apparatus is described, for example, in the U.S. Pat. No 4,226,214 in the name of the present applicants. This apparatus also includes means for the recovery and reutilization of the energy transformed into heat in the internal combustion engine and the electrical machine.

The operation of the generator apparatus is controlled by electronic circuits within the casing.

These electronic control circuits include, among other things, electronic power devices which in operation give off a considerable amount of heat. For these electronic circuits to operate properly and have a long working life, it is necessary for this heat to be dissipated as simply as possible.

For this purpose, one could, for example, install a fan device within the casing of the generator apparatus, the rotor of which may be rotated by means of the shaft of the internal combustion engine or by an electric motor supplied with the energy produced by the electrical machine.

This solution has the disadvantages of requiring the installation of a fan device and of further reducing the overall efficiency of the generator apparatus itself. The driving of the fan rotor by the shaft of the internal combustion engine would result in an increase in the resistant torque applied to the shaft. On the other hand, whenever the fan rotor were driven by means of a fraction of the electrical energy produced by the electrical machine, the net electrical power suppliable by the generator apparatus would be subject to a slight but not insignificant reduction.

The object of the present invention is to provide generator apparatus of the type specified above, in which the electronic control circuits can be ventilated without the need to install extra devices and without causing a reduction in the overall output of the generator apparatus itself.

In order to achieve this object, the present invention provides generator apparatus for the combined production of electrical energy and heat, of the type specified above, in which the internal combustion engine has an air filter the inlet of which communicates with an aperture formed in a side wall of the support casing, characterised in that it further includes a covering and protecting element fixable sealingly and removably to the outer surface of the side wall of the casing, in that the electronic circuits are supported by at least one plate fixed to the outer surface of the side wall of the casing in the region defined between this wall of the casing and the covering and protecting element when the latter is fixed to the wall, and in that the covering and protecting element has at least one aperture through which said region communicates with the exterior whereby, in operation, the electronic circuits are ventilated by air which is drawn in by the engine and flows into the said region through the aperture.

By virtue of this characteristic, in operation, the internal combustion engine draws air from outside the generator apparatus and this air flows through the aperture of the covering and protecting element, over the electronic circuits supported between the covering and protecting element and the side wall of the casing, and then enters the air filter of the engine through the aperture formed in the side wall of the casing.

Thus two advantageous results are achieved: an effective ventilation of the electronic control circuits and, at the same time, a slight pre-heating of the air drawn into the internal combustion engine.

Further characteristics and advantages of the generator apparatus according to the present invention will appear from the detailed description which follows, made with reference to the appended drawings, provided purely by way of non-limiting example, in which.

Figure 1:
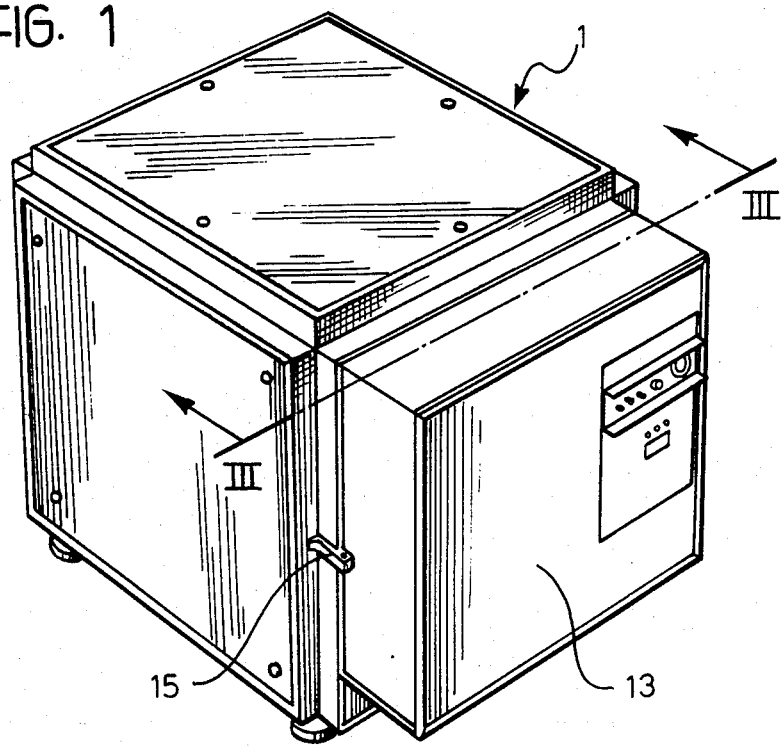
FIG. 1 is a perspective view of generator apparatus according to the invention.

With reference to the drawings, generator apparatus for the combined production of electrical energy and heat includes a support casing 1 which has a substantially parallelepipedal shape and houses an internal combustion engine 2 the shaft of which is coupled to the shaft of an asynchronous electrical machine 3 usable both for starting the engine 2 and for the production of electrical energy.

The generator apparatus further includes means for the recovery and reutilization of the energy transformed into heat in the internal combustion engine 2 and the electrical machine 3. These recovery and reutilization means for the thermal energy are described in detail and illustrated in the aforementioned U.S. Patent and therefore will not be further described below.

The internal combustion engine 2 is provided with an air filter 4 (FIG. 2) connected by means of a duct 5 to the induction manifold of the engine. The air filter 4 has an inlet opening 4a connected to an aperture 6 formed in a side wall 7 of the casing 1.

Figure 3:
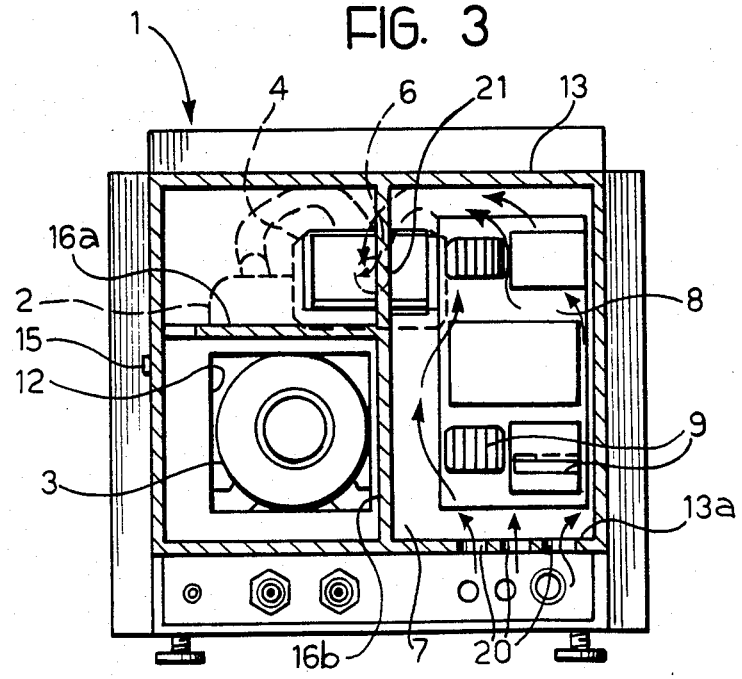
FIG. 3 is a sectional view taken on the line III—III of FIG. 1.
Figure 2:
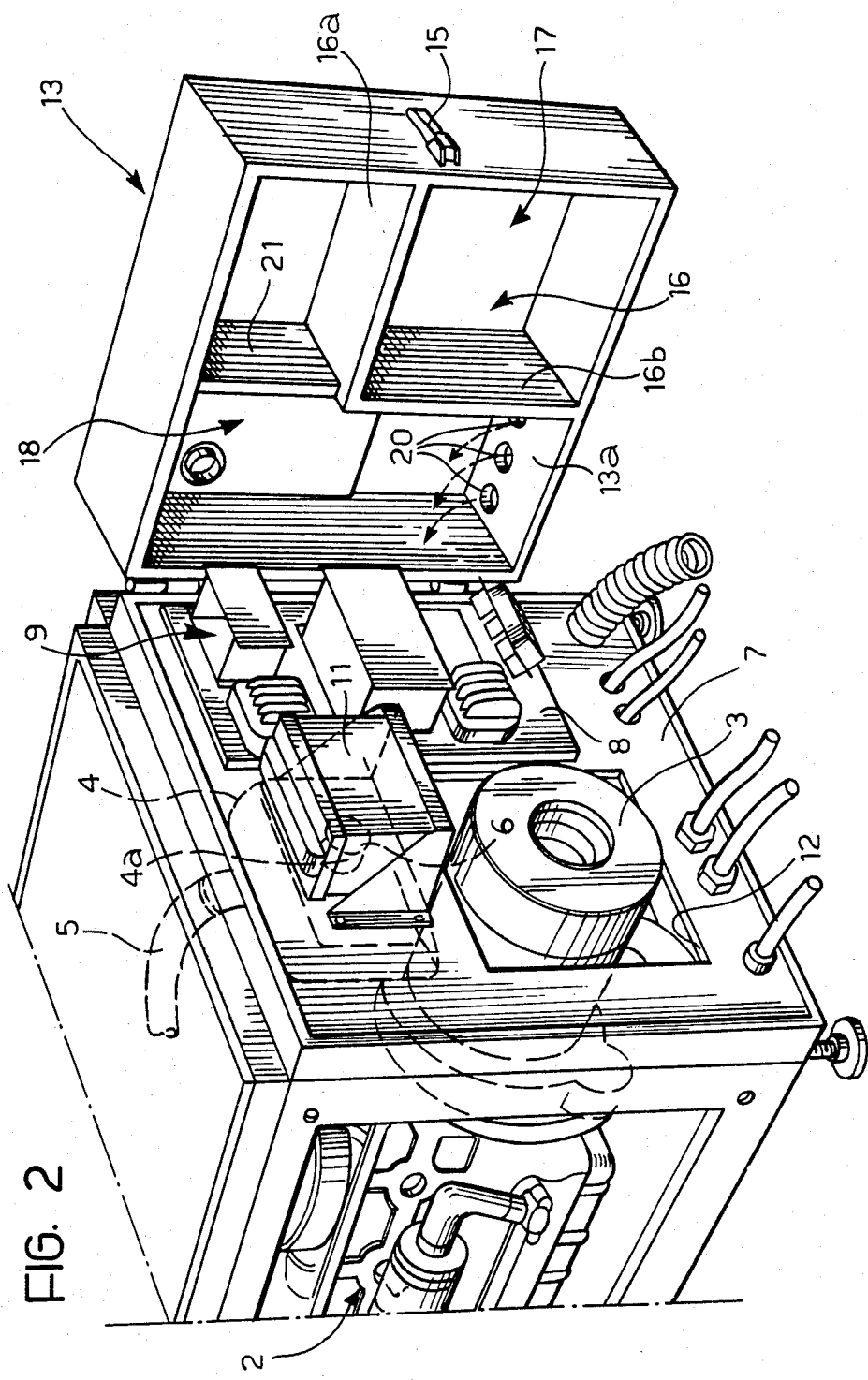
FIG. 2 is a partial perspective view of the apparatus of FIG. 1, showing a covering and protecting element in its open position.

FIGS. 2 and 3 show a plate 8 which is fixed to the outer surface of the side wall 7 of the casing 1. This plate supports a plurality of electronic control circuits, generally indicated 9, for controlling the operation of the generator apparatus.

The plate is fixed to the wall 7 adjacent a vertical edge thereof.

A bracket 10 is fixed to the side wall 7 of the casing 1 adjacent the aperture 6 in the wall. The bracket 10 supports an accumulator battery 11 which is located facing and spaced from the portion of the wall 7 surrounding the aperture 6.

The side wall 7 of the casing 1 has a further aperture 12 of substantially rectangular shape through which an end portion of the electrical machine 3 extends.

A covering and protecting element 13 is shown, which has the form of a substantially parallelepipedal box open at a larger side. This covering and protecting element is connected to one vertical edge of the side wall 7 of the casing 1 adjacent the support plate 8, so as to be rotatable between an open position illustrated in FIG. 2 and a closed position illustrated in FIG. 1. In the closed position, the covering and protecting element 13 may be locked sealingly against the outer surface of the wall 7 of the casing by means of a manual locking device 15 of conventional type. In this position, the covering and protecting element 13 defines, together with the side wall 7 of the casing 1, a region in which the bracket 10, the battery 11 supported thereby, and the support plate 8 with its respective electronic circuits 9, are located.

A partition 16 extends perpendicularly from the main wall of the covering and protecting element 13 to the edge of the opening of the latter. This partition includes two sections 16a, 16b which lie in mutually orthogonal and perpendicular planes and divide the region within the covering and protecting element 13 into two spaces 17, 18.

The space 18 has an essentially inverted L-shape, while the space 17 has a substantially parallelepipedal shape.

In that portion of the lower wall 13a of the covering and protecting element 13 which defines the lower part of the space 18 of this covering element are formed three circular apertures 20 (FIGS. 2 and 3).

The space 18 is further subdivided into two substantially parallelepiped shaped compartments by means of a further partition 21 which projects as an elongation of the section 16b of the partition 16.

The partition 21 extends from the main wall of the covering and protecting element 13 but does not reach the edge of the opening of the latter.

As is apparent from FIG. 3, when the covering and protecting element 13 is in its closed position, the free edges of the sections 16a, 16b of the partition 16 engage the outer surface of the side wall 7 of the casing 1 around the outside of the aperture 12 in this wall through which the electrical machine 3 projects. The spaces 17, 18 within the covering element thus do not communicate with each other.

On the other hand, in the closed condition of the covering and protecting element 13, the two compartments into which the space 18 is subdivided by the partition 21 communicate with each other through a slot defined by the side wall 7 of the casing and the free edge of the partition 21.

In the closed condition of the covering element 13, the two compartments making up the space 18 house the accumulator battery 11 and the support plate 8 with its associated electronic circuits, respectively (FIG. 3).

In operation, when the covering and protecting element 13 is locked in its closed position, a flow of air is drawn in by the internal combustion engine 2 through the filter 4, passing through the aperture 6 in the side wall 7 of the casing, the space 18 within the covering and protecting element 13, and the apertures 20 formed in the latter. The path followed by the indrawn air is clearly illustrated in FIG. 3. As shown in this drawing, the air enters the covering and protecting element 13 through the apertures 20, flows over the electronic circuits 9 carried by the support plate 8 to facilitate the dissipation of heat produced by the circuits, then passes through the slot defined by the free edge of the partition 21 and the side wall 7 of the casing, flows over the battery 11, and finally enters the air filter 4 through the aperture 6 in the wall 7 behind the battery 11.

As described above, the air flow facilitates the dissipation of the heat developed during operation of the electronic control circuits 9, has a useful ventilating action on the battery 11, and finally reaches the internal combustion engine 2 through the filter 4. A further advantage results from the slight preheating of the air drawn into the engine before it reaches the latter.

The covering and protecting element 13 may be easily unlocked and moved to its open position, illustrated in FIG. 2, whenever it is necessary to have access to the electronic control circuits 9 or the battery 11 for the purposes of maintenance or repair.

Naturally, the invention covers all embodiments which achieve the same efficiency or utility by using the same innovative concept.

What is claimed is:

1. A generator apparatus for the combined production of electrical energy and heat comprising a parallelepiped-shaped housing, a combination internal combustion engine and electrical machine mounted in said housing, said housing having a side wall provided with first and second apertures adjacent one vertical edge thereof with said first aperture located above said second aperture, duct means in said housing communicating said first aperture with said internal combustion engine for supplying air thereto with said electrical machine extending outwardly of said housing through said second aperture, a battery mounted on said side wall outside of said housing in spaced relation to said aperture, electrical equipment means mounted on said side wall adjacent the opposite vertical edge thereof, a cover member in the form of a substantially parallelepiped box open at one side thereof hinged to one of said vertical side edges of said housing covering said electrical machine, said battery and said electrical equipment means when pivoted against said side wall, a partition in said cover member adapted to engage said side wall in the closed position for dividing said cover member into a first chamber which completely encloses said electrical machine and a second chamber which completely encloses said electrical equipment means and said battery with said first and second chambers being isolated from each other, and opening means in said cover member adjacent the bottom thereof whereby upon operation of said internal combustion engine, air will be drawn into said cover member through said opening means and pass over said electrical equipment means and said battery before being drawn into said internal combustion engine through said first aperture and duct means as preheated air.

* * * * *